United States Patent
Choi et al.

(10) Patent No.: US 10,517,180 B2
(45) Date of Patent: Dec. 24, 2019

(54) DISPLAY DEVICE AND METHOD FOR DRIVING THE SAME

(71) Applicant: SAMSUNG DISPLAY CO., LTD., Yongin-si, Gyeonggi-do (KR)

(72) Inventors: Byeong Hwa Choi, Yongin-si (KR); Seung Bae Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/883,666

(22) Filed: Jan. 30, 2018

(65) Prior Publication Data
US 2019/0053387 A1    Feb. 14, 2019

(30) Foreign Application Priority Data
Aug. 14, 2017   (KR) .......................... 10-2017-0103238

(51) Int. Cl.
| | |
|---|---|
| *H05K 1/00* | (2006.01) |
| *H05K 5/00* | (2006.01) |
| *H01L 51/52* | (2006.01) |
| *H05K 5/02* | (2006.01) |
| *B65H 16/10* | (2006.01) |

(Continued)

(52) U.S. Cl.
CPC ......... *H05K 5/0017* (2013.01); *B65H 16/103* (2013.01); *B65H 18/10* (2013.01); *B65H 18/28* (2013.01); *G01D 5/305* (2013.01); *G06F 1/1652* (2013.01); *G06F 3/044* (2013.01); *G06F 3/0412* (2013.01); *G09G 3/001* (2013.01); *H01L 51/524* (2013.01); *H05K 5/0217* (2013.01); *G06F 2203/04102* (2013.01);

(Continued)

(58) Field of Classification Search
CPC .. H05K 5/0017; H05K 5/0217; H01L 51/524; G01D 5/305; B65H 18/10; B65H 18/28
USPC .......................................................... 361/749
See application file for complete search history.

(56) References Cited

U.S. PATENT DOCUMENTS

| | | | |
|---|---|---|---|
| 9,098,241 B1 * | 8/2015 | Cho | ....................... H05K 1/028 |
| 9,710,020 B2 | 7/2017 | Choi et al. | |

(Continued)

FOREIGN PATENT DOCUMENTS

KR             101649097 B1     8/2016

OTHER PUBLICATIONS

Extended European Search Report for Application No. 18188926.2 dated Nov. 12, 2018.

*Primary Examiner* — Hung S. Bui
(74) *Attorney, Agent, or Firm* — Cantor Colburn LLP

(57) ABSTRACT

A display device includes a flexible display panel; a rolling driver including a rolling shaft connected to the flexible display panel and a rotation motor which rotates the rolling shaft; a housing which receives the flexible display panel in a rolled state, where a first opening is defined in the housing for unrolling and rolling the flexible display panel; a rolling stopper coupled to the flexible display panel; and a rolling controller which controls the rolling driver such that the rotation motor rotates in a clockwise or counterclockwise direction. The rolling controller rotates the rotating motor in a direction opposite to a rotating direction of the rotation motor for a previous rolling to unroll the flexible display panel. The rolling controller rotates the rotating motor in a same direction as a rotating direction of the rotation motor for a previous unrolling to roll the flexible display panel.

19 Claims, 8 Drawing Sheets

(51) Int. Cl.

| | |
|---|---|
| *B65H 18/28* | (2006.01) |
| *G01D 5/30* | (2006.01) |
| *B65H 18/10* | (2006.01) |
| *G06F 1/16* | (2006.01) |
| *G06F 3/041* | (2006.01) |
| *G06F 3/044* | (2006.01) |
| *G09G 3/00* | (2006.01) |
| *H01L 27/32* | (2006.01) |

(52) U.S. Cl.
CPC ............. *G06F 2203/04103* (2013.01); *G09G 2380/02* (2013.01); *H01L 27/3244* (2013.01); *H01L 2251/5338* (2013.01)

(56) References Cited

U.S. PATENT DOCUMENTS

| | | | |
|---|---|---|---|
| 9,877,384 B2* | 1/2018 | Lee | G06F 1/1652 |
| 2007/0216639 A1* | 9/2007 | LaFarre | G02F 1/167 |
| | | | 345/107 |
| 2014/0002430 A1 | 1/2014 | Kwack et al. | |
| 2015/0029229 A1 | 1/2015 | Voutsas | |
| 2016/0187929 A1 | 6/2016 | Kim et al. | |
| 2017/0031387 A1* | 2/2017 | Kim | G06F 1/1652 |
| 2017/0140504 A1* | 5/2017 | Jeong | G06F 1/1677 |
| 2017/0309226 A1* | 10/2017 | In | G06F 1/1652 |
| 2017/0318693 A1* | 11/2017 | Kim | H02K 11/21 |
| 2018/0014415 A1 | 1/2018 | Choi et al. | |

* cited by examiner

DISPLAY DEVICE AND METHOD FOR DRIVING THE SAME

This application claims priority to Korean Patent Application No. 10-2017-0103238, filed on Aug. 14, 2017, and all the benefits accruing therefrom under 35 U.S.C. § 119, the content of which in its entirety is herein incorporated by reference.

BACKGROUND

1. Field

Exemplary embodiments of the disclosure relate to a display device and a method for driving the display device.

2. Description of the Related Art

A rollable display device may include a flexible display panel which may be rolled to be stored in a housing and unrolled out of the housing, as desired. The rollable display device may be highly portable, since the volume thereof in a rolled state is substantially less than the volume thereof in an unrolled state.

SUMMARY

An exemplary embodiment of the disclosure relates to a display device including a flexible display panel in which rolling direction and unrolling direction thereof is variable and a method for driving the display device.

According to an embodiment of the disclosure, there is provided a display device.

According to an embodiment of the disclosure, a display device includes a flexible display panel; a rolling driver including a rolling shaft connected to one end of the flexible display panel, and a rotation motor which rotates the rolling shaft; a housing which receives the flexible display panel in a rolled state, where a first opening is defined in the housing for unrolling and rolling the flexible display panel; a rolling stopper coupled to another end of the flexible display panel, which is opposite to the one end; and a rolling controller which controls the rolling driver such that the rotation motor rotates in a clockwise direction or a counterclockwise direction. In such an embodiment, the rolling controller rotates the rotating motor in a direction opposite to a rotating direction of the rotation motor for a previous rolling operation to unroll the flexible display panel, and the rolling controller rotates the rotating motor in a same direction as a rotating direction of the rotation motor for a previous unrolling operation to roll the flexible display panel.

In an embodiment of the disclosure, the display device may further include a sensor unit which senses a completion of rolling of the flexible display panel.

In an embodiment of the disclosure, the sensor unit may be disposed on an external surface of the housing.

In an embodiment of the disclosure, the sensor unit may be a contact sensor, and the sensor unit senses the completion of rolling of the flexible display panel based on a contact thereof with the rolling stopper.

In an embodiment of the disclosure, the sensor unit may be disposed on an inner surface of the housing, and a second opening may be defined in the housing to expose a part of the sensor unit.

In an embodiment of the disclosure, the rolling stopper may further include a protrusion portion corresponding to the second opening, and the sensor unit may sense the completion of rolling of the flexible display panel based on a contact thereof with the protrusion portion.

In an embodiment of the disclosure, the sensor unit may include a light emitting portion which emits light to the second opening and a light receiving portion which absorbs light reflected by the rolling stopper.

In an embodiment of the disclosure, the rolling shaft may include a body portion having a rod shape and a panel coupling portion having a trench shape which is recessed in a part of the body portion.

In an embodiment of the disclosure, the body portion may include a first curvature portion with a first curvature, a second curvature portion with a second curvature different from the first curvature, and a third curvature portion with a third curvature different from the first curvature, when viewed in a cross section perpendicular to a length direction.

In an embodiment of the disclosure, one end of the second curvature portion may be connected to one end of the first curvature portion, the other end of the second curvature portion may be connected to the panel coupling portion, one end of the third curvature portion may be connected to the other end of the first curvature portion, and the other end of the third curvature portion may be connected to the panel coupling portion.

In an embodiment of the disclosure, the second curvature and the third curvature may be greater than the first curvature.

In an embodiment of the disclosure, the second curvature may be substantially the same as the third curvature.

According to another embodiment of the disclosure, a method for driving a display device includes first unrolling a flexible display panel of the display device by rotating a rotation motor of the display device in any one direction of a clockwise direction and a counterclockwise direction; first rolling the flexible display panel by rotating the rotation motor in a same direction as a rotation direction of the rotation motor for the first unrolling the flexible display panel; and second unrolling the flexible display panel by rotating the rotation motor in an opposite direction opposite, which is opposite to the rotation direction of the rotation motor for the first rolling the flexible display panel.

In an embodiment of the disclosure, the method may further include transmitting a rolling completion signal to a rolling controller of the display device by sensing a completion of rolling of the flexible display panel a the sensor unit of the display device.

In an embodiment of the disclosure, the method may further include generating rotation change data, by the rolling controller, for the rotating the rotation motor in the opposite direction in the second unrolling the flexible display panel, when the rolling controller receives the rolling completion signal.

In an embodiment of the disclosure, the method may further include second rolling the flexible display panel by rotating the rotation motor in the opposite direction, after the second unrolling the flexible display panel.

In an embodiment of the disclosure, one end of the flexible display panel may be connected to a rolling shaft of the display device, where the rolling shaft is coupled to the rotation motor, and another end of the flexible display panel, which is opposite to the one end, may be connected to a rolling stopper of the display device.

In an embodiment of the disclosure, the sensor unit may sense the completion of rolling of the flexible display panel based on a contact thereof with the rolling stopper.

In an embodiment of the disclosure, the sensor unit may include a light emitting portion which emits light and a light receiving portion which absorbs light reflected by the rolling stopper, and the sensor unit may sense the completion of rolling of the flexible display panel by sensing the light reflected by the rolling stopper in the light receiving portion.

In such embodiments, a display device may effectively prevent a flexible display panel from being deformed by changing a rolling direction and an unrolling direction of the flexible display panel.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION OF THE EMBODIMENT

Figure 1:
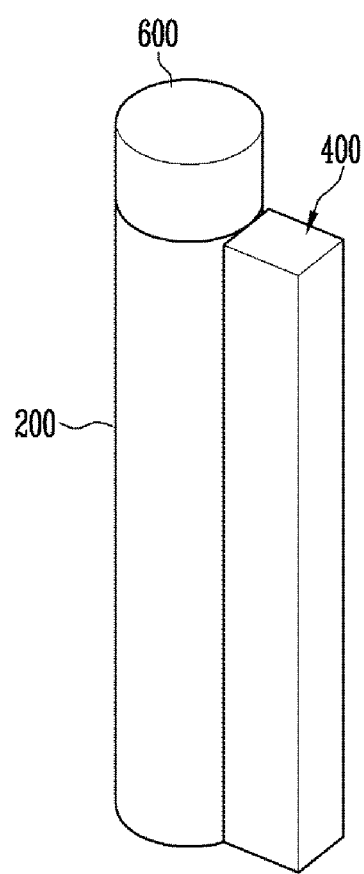
FIG. 1 is a perspective view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
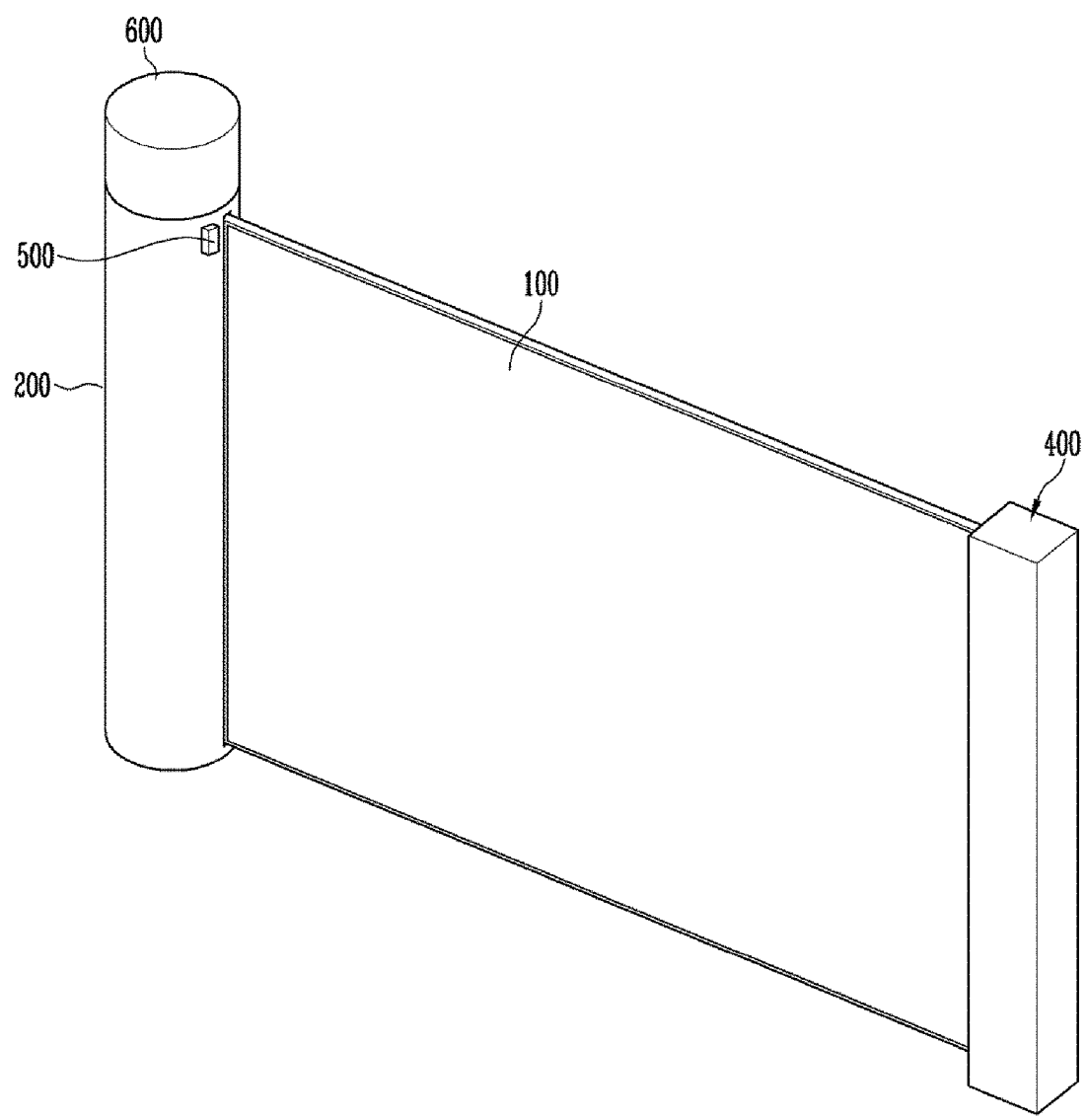
FIG. 2 is a perspective view illustrating a state in which a flexible display panel in the display device of FIG. 1 is unrolled.
Figure 3:
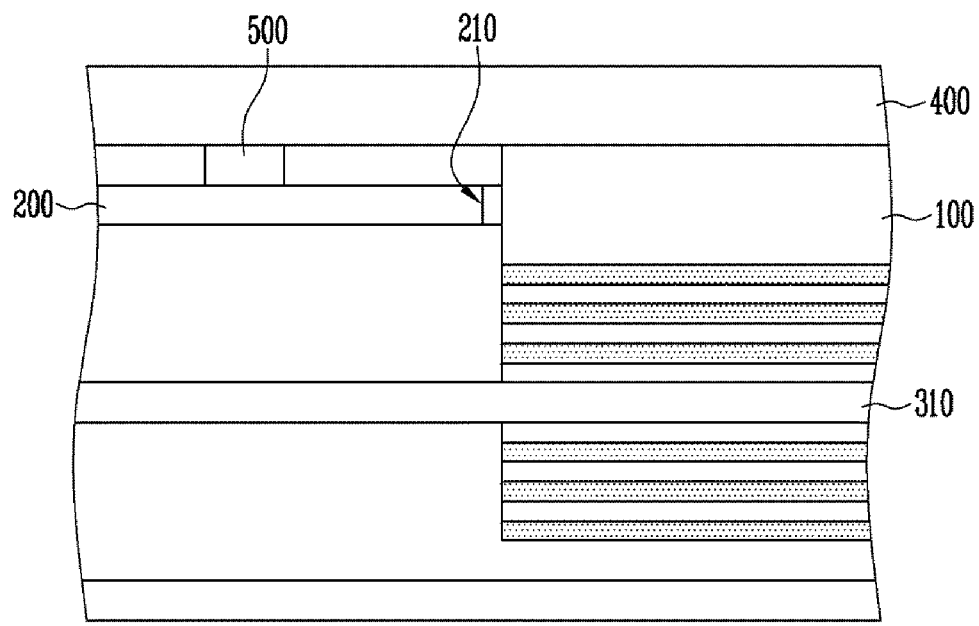
FIG. 3 is a partial cross-sectional view of the display device illustrated in FIG. 1.
Figure 4:
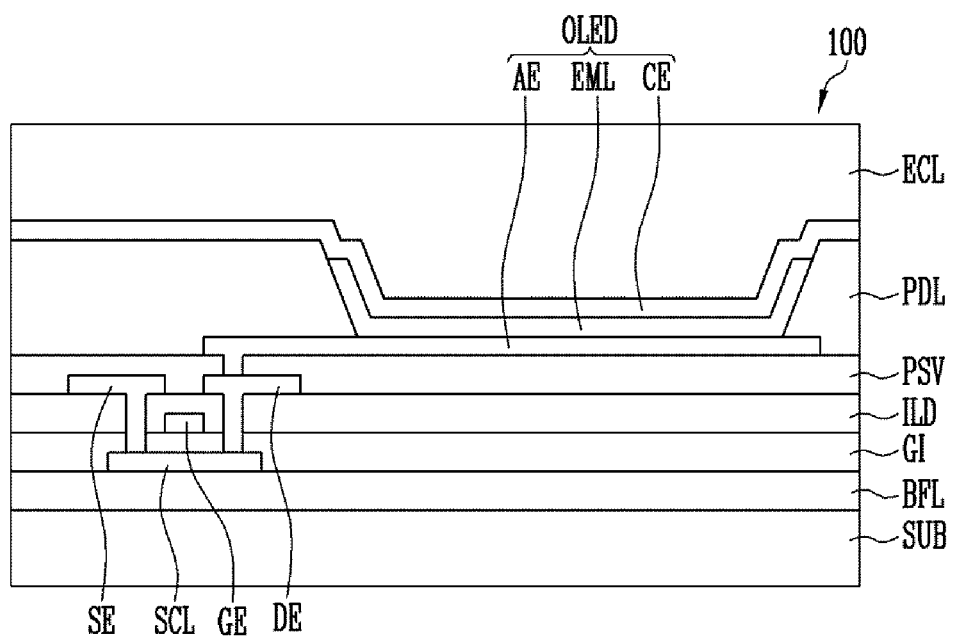
FIG. 4 is a cross-sectional view illustrating a pixel of the display panel illustrated in FIG. 2.
Figure 5:
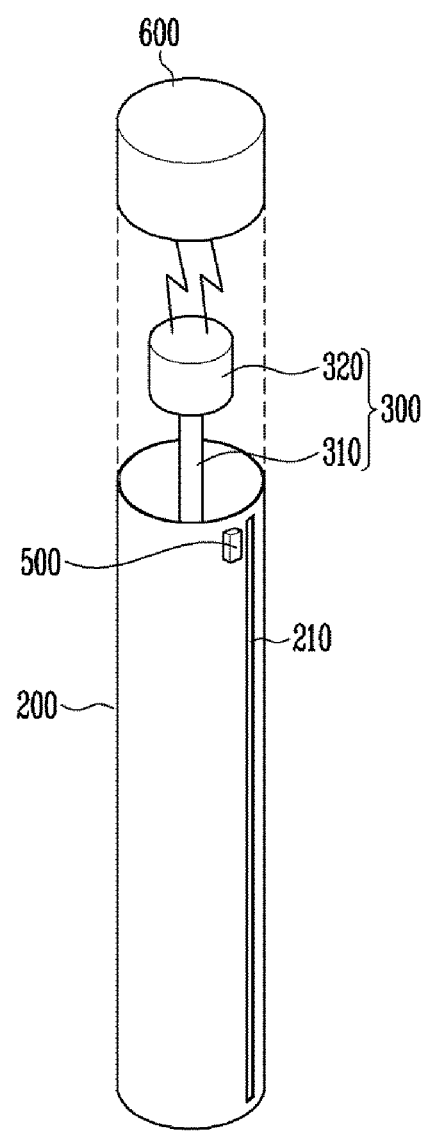
FIG. 5 is an exploded perspective view illustrating a housing, a rolling driver and a rolling controller illustrated in FIGS. 1 and 2.
Figure 6:
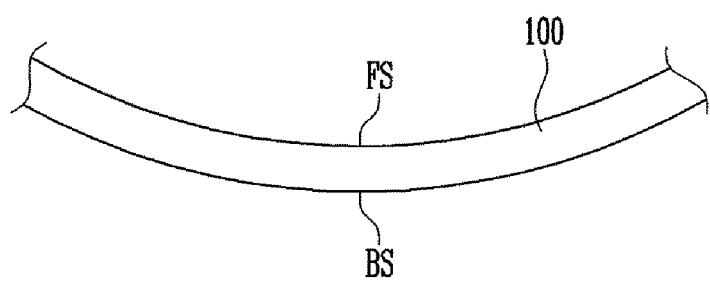
FIGS. 6 and 7 are partial sectional views of the display panel, in which a stress is applied in an unrolled state illustrated in FIG. 2.
Figure 7:
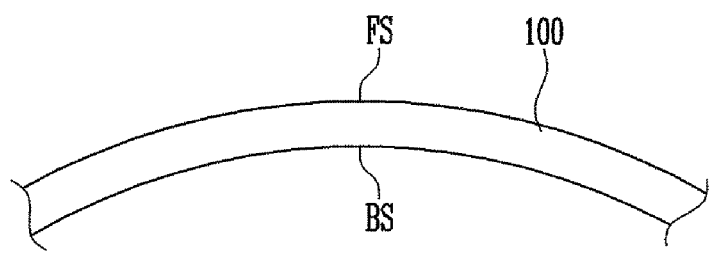

FIG. 1 is a perspective view illustrating a display device according to an embodiment of the disclosure. FIG. 2 is a perspective view illustrating a flexible display panel in the display device of FIG. 1 in an unrolled state. FIG. 3 is a partial cross-sectional view of the display device illustrated in FIG. 1, taken in a length direction in a state where the flexible display panel is rolled. FIG. 4 is a partial cross-sectional view illustrating a pixel of the display panel illustrated in FIG. 2. FIG. 5 is an exploded perspective view illustrating a housing, a rolling driver and a rolling controller illustrated in FIGS. 1 and 2. FIGS. 6 and 7 are partial sectional views illustrating the display panel in an unrolled state illustrated in FIG. 2 and in a state where a stress is applied thereto.

Referring to FIGS. 1 to 7, an embodiment of the display device may include a flexible display panel 100, a housing 200 which contains the flexible display panel 100, a rolling driver 300 which rolls or unrolls the flexible display panel 100, a rolling stopper 400 which stops rolling of the flexible display panel 100, a sensor unit 500 which senses whether or not the flexible display panel 100 is in a rolled state, and a rolling controller 600 which controls an operation of the rolling driver 300.

The flexible display panel 100 may display a video. The flexible display panel 100 is not limited to a particular type of display panel. In one embodiment, for example, the flexible display panel 100 may be a self-luminous display panel such as an organic light emitting display panel ("OLED panel"). In an alternative embodiment, the flexible display panel 100 may be a liquid crystal display ("LCD") panel, an electro-phoretic display ("EPD") panel, and an electro-wetting display ("EWD") panel. In an embodiment, where a non-luminous display panel is used as the flexible display panel 100, the display device may include a backlight unit which provides light to the flexible display panel 100. Hereinafter, for convenience of description, embodiments where the flexible display panel 100 is an organic light emitting display panel will be described in detail.

The flexible display panel 100 may have two surfaces. In one embodiment, for example, the flexible display panel 100 may include a first surface FS from which light is emitted, and a second surface BS facing the first surface FS.

The flexible display panel 100 may have various planar shapes. In one embodiment, for example, the flexible display panel 100 may have a closed polygonal shape including straight sides. In an alternative embodiment, the flexible display panel 100 may have a shape such as a circle or an ellipse including curved sides. In another alternative embodiment, the flexible display panel 100 may also have a shape such as a semi-circle or a semi-ellipse including sides having a straight line and a curved line.

The first surface of the flexible display panel 100 may include a display region (not illustrated) and a non-display region (not illustrated) around the display region.

The display region may have a shape corresponding to a shape of the flexible display panel 100. In one embodiment, for example, the display region may have a closed polygonal shape including a straight side. In an alternative embodiment, the display region may have a shape such as a circle or an ellipse including a curved side. In another alternative embodiment, the display region may also have a shape such as a semi-circle or a semi-ellipse including sides having a straight line and a curved line.

A plurality of pixels may be disposed in the display region. Each pixel may be any one of a red pixel, a green pixel, a blue pixel and a white pixel, but the disclosure is not limited thereto. In one alternative embodiment, for example, the pixel may be any one of a magenta pixel, a cyan pixel, and a yellow pixel.

In an embodiment, the flexible display panel 100 may include a display panel driver on one side of a substrate SUB to drive the pixels. In an embodiment, the display panel driver may be a chip-on-glass ("COG") type driver.

In an embodiment, as shown in FIG. 4, the pixel may include the substrate SUB, a thin film transistor disposed on the substrate SUB, and a display element OLED connected to the thin film transistor. The display element OLED may be an organic light emitting device.

The substrate SUB may include a transparent insulating material which transmits light therethrough. A surface exposed to an outside of the substrate SUB, or an external surface of the substrate SUB, may define the second surface BS of the flexible display panel 100.

In an embodiment, the substrate SUB may be a flexible substrate. The flexible substrate may include a film substrate and a plastic substrate which include a polymer organic material. In one embodiment, for example, the flexible substrate may include at least one of polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), triacetate cellulose ("TAC"), and cellulose acetate propionate ("CAP"). In an embodiment, the flexible substrate may include a fiber glass reinforced plastic ("FRP").

In such an embodiment, it is desired that a material applied to the substrate SUB has resistance (or thermal resistance) against a high processing temperature in a manufacturing process of the display device.

In an embodiment, as shown in FIG. 4, a buffer layer BFL may be disposed between the substrate SUB and the thin film transistor. The buffer layer BFL may include an inorganic insulating material. In one embodiment, for example, the buffer layer BFL may include at least one of a silicon oxide, a silicon nitride and a silicon oxynitride. In an embodiment, the buffer layer BFL may have a single-layer structure or a multi-layer structure. In one embodiment, for example, the buffer layer BFL may have a single-layer structure including at least one of a silicon oxide, a silicon nitride and a silicon oxynitride. The buffer layer BFL may have a double-layer structure including a silicon oxide film, and a silicon nitride film on the silicon oxide film. The buffer layer BFL may include three or more insulating films sequentially stacked one on another.

The buffer layer BFL may effectively prevent impurities from diffusing from the substrate SUB into the thin film transistor. The buffer layer BFL may planarize a surface of the substrate SUB.

The thin film transistor may be connected to a gate line (not illustrated) and a data line (not illustrated). The thin film transistor may include a semiconductor layer SCL, a gate electrode GE, a source electrode SE, and a drain electrode DE.

The semiconductor layer SCL may be disposed on the buffer layer BFL. The semiconductor layer SCL may include at least one of amorphous silicon (Si), poly crystalline silicon (Si), an oxide semiconductor, and an organic semiconductor. In the semiconductor layer SCL, regions connected to the source electrode SE and the drain electrode DE may be a source region and a drain region, which are doped or injected with impurities. A region between the source region and the drain region may be a channel region.

In an embodiment, where the semiconductor layer SCL includes an oxide semiconductor, a light shielding film (not shown) which shields light entering the semiconductor layer SCL from an upper portion or a lower portion of the semiconductor layer SCL may also be provided.

A gate insulating film GI may be disposed on the semiconductor layer SCL. The gate insulating film GI may cover the semiconductor layer SCL and may isolate or insulate the semiconductor layer SCL and the gate electrode GE. The gate insulating film GI may include at least one of an organic insulating material and an inorganic insulating material. In one embodiment, for example, the gate insulating film GI may include at least one of a silicon oxide and a silicon nitride.

The gate electrode GE may be disposed on the gate insulating film GI. The gate electrode GE may be connected to a gate line. The gate electrode GE may include a conductive material with low resistance and may overlap the semiconductor layer SCL.

An interlayer insulating film ILD may be disposed on the gate electrode GE. The interlayer insulating film ILD may include at least one of an organic insulating material and an inorganic insulating material. In one embodiment, for example, the interlayer insulating film ILD may include at least one of a silicon oxide and a silicon nitride. The interlayer insulating film ILD may isolate or insulate the source electrode SE, the drain electrode DE and the gate electrode GE from each other.

Contact holes are defined through the gate insulating film GI and the interlayer insulating film ILD to expose the source region and the drain region of the semiconductor layer SCL.

The source electrode SE and the drain electrode DE may be disposed on the interlayer insulating film ILD and spaced apart from each other. The source electrode SE and the drain electrode DE may include a conductive material with low resistance. One end of the source electrode SE may be connected to the data line, and the other end of the source electrode SE may be connected to the source region through one of the contact holes. One end of the drain electrode DE may be connected to the drain region through another contact hole, and the other end of the drain electrode DE may be connected to the display element OLED.

In an embodiment, the thin film transistor is a thin film transistor with a top gate structure as shown in FIG. 4, but the disclosure is not limited thereto. In one alternative embodiment, for example, the thin film transistor may be a thin film transistor with a bottom gate structure.

A protective film PSV may be disposed on the thin film transistor. The protective film PSV may cover the thin film transistor. A part of the protective film PSV may be removed to expose one of the source electrode SE and the drain electrode DE, for example, the drain electrode DE.

The protective film PSV may include one or more films. In one embodiment, for example, the protective film PSV may include an inorganic protective film and an organic protective film disposed on the inorganic protective film. In such an embodiment, the inorganic protective film may include at least one of a silicon oxide and a silicon nitride, and the organic protective layer may include at least one of acryl, PI, polyamide ("PA"), and benzocyclobutene ("BOB"). In an embodiment, the organic protective film may be a planarizing film that is transparent and has fluidity to planarize an underlying structure by reducing bending thereof.

The display element OLED may be disposed on the protective film PSV. The display element OLED may include a first electrode AE connected to the thin film transistor, the light emitting layer EML disposed on the first electrode AE, and a second electrode CE disposed on the light emitting layer EML. In such an embodiment, one of the first electrode AE and the second electrode CE may be an anode electrode, and the other of the first electrode AE and the second electrode CE may be a cathode electrode. In one embodiment, for example, the first electrode AE may be the anode electrode, and the second electrode CE may be the cathode electrode.

In an embodiment, at least one of the first electrode AE and the second electrode CE may be a transmissive electrode. In one embodiment, for example, where the display element OLED is a bottom emission type organic light emitting element, the first electrode AE may be the transmissive electrode and the second electrode CE may be a reflective electrode. In an alternative embodiment, where the display element OLED is a top emission type organic light emitting element, the first electrode AE may be the reflective electrode and the second electrode CE may be the transmissive electrode. In another alternative embodiment, where the display element OLED is a dual-side emission type organic light emitting element, both the first electrode AE and the second electrode CE may be the transmissive electrodes. For convenience of description, embodiments where the display element OLED is the top emission type organic light emitting element and the first electrode AE is the anode electrode will be described in detail.

In each pixel, the first electrode AE may be disposed on the protective film PSV. The first electrode AE may include a transparent conductive film (not illustrated) which transmits light therethrough, and a reflective film (not illustrated) which reflects light incident thereto. The reflective film may be disposed on the top or the bottom of the transparent conductive film. At least one of the transparent conductive film and the reflective film may be connected to the drain electrode DE.

The transparent conductive film may include a transparent conductive oxide. In one embodiment, for example, the transparent conductive oxide includes at least one of an indium tin oxide ("ITO"), an indium zinc oxide ("IZO"), an aluminum zinc oxide ("AZO"), a gallium doped zinc oxide ("GZO"), a zinc tin oxide ("ZTO"), a gallium tin oxide ("GTO"), and a fluorine doped tin oxide ("FTO").

The reflective layer may include a material capable of reflect light. In one embodiment, for example, the reflective film may include at least one of aluminum (Al), silver (Ag), chrome (Cr), molybdenum (Mo), platinum (Pt), nickel (Ni), and an alloy thereof.

A pixel defining film PDL may be disposed on the first electrode AE. The pixel defining film PDL may be disposed between the pixel regions and may expose the first electrode AE. In an embodiment, the pixel defining film PDL may overlap an edge portion of the first electrode AE. Accordingly, in such an embodiment, the pixel defining film PDL may expose substantially an entire upper surface of the first electrode AE.

The pixel defining film PDL may include an organic insulating material. In one embodiment, for example, the pixel defining film PDL may include at least one of polystyrene, polymethylmethacrylate ("PMMA"), polyacrylonitrile ("PAN"), PA, PI, polyarylether ("PAE"), heterocyclic polymer, parylene, epoxy, BCB, a siloxane-based resin, and a silane-based resin.

The light emitting layer EML may be disposed on the exposed surface of the first electrode AE. The light emitting layer EML may have a multi-layer thin film structure including at least a light generation layer. In one embodiment, for example, the light emitting layer EML may include a hole injection layer ("HIL") for injecting holes, a hole transport layer ("HTL") which has high hole transportability and suppresses movement of electrons not coupled in a light generating layer, thereby increasing a chance of recombination of holes and electrons, the light generation layer which emits light in accordance with recombination of the injected holes and electrons, a hole blocking layer ("HBL") which suppresses movement of holes not coupled in the light generating layer, an electron transport layer ("ETL") for smoothly transporting electrons to the light generating layer, and an electron injection layer ("EIL") for injecting electrons.

In an embodiment, color of light generated in the light generating layer may be one of red, green, blue, and white, but is not limited thereto. In one alternative embodiment, for example, the color of light generated in the light generating layer of the light emitting layer EML may be one of magenta, cyan, and yellow.

The HIL, the HTL the HBL, the ETL and the IEL may be common films connected to each other in adjacent pixel regions, that is, films disposed to cover the entire pixel regions.

The second electrode CE may be dispose on the light emitting layer EML. The second electrode CE may be a transflective film. In one embodiment, for example, the second electrode CE may be a thin metal layer with a thickness thin enough to transmit light therethrough. The second electrode CE may transmit a part of light generated in the light generating layer therethrough and may reflect the remaining light generated in the light generating layer.

The second electrode CE may include a material with a lower work function than the transparent conductive film. In one embodiment, for example, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and an alloy thereof.

In an embodiment, some of light emitted from the light emitting layer EML may not transmit to the second electrode CE, and light reflected from the second electrode CE may be reflected again by the reflective layer. In such an embodiment, light emitted from the light emitting layer EML may resonate between the reflective film and the second electrode CE. In such an embodiment, light extraction efficiency of the display element OLED may be improved by the resonance of the light.

A distance between the reflective layer and the second electrode CE may be determined based on color of the light generated in the light generating layer. In an embodiment, the distance between the reflective layer and the second electrode CE may be adjusted to match a resonance distance, depending on the color of the light generated in the light generating layer.

A capping layer ECL may be disposed on the second electrode CE. The capping layer ECL may cover the display element OLED to prevent oxygen and moisture from penetrating into the display element OLED. A surface exposed to the outside of the capping layer ECL, that is, an external surface of the capping layer ECL, may define the first surface FS of the flexible display panel 100.

In an embodiment, the capping layer ECL may include a plurality of insulating films. In one embodiment, for example, the capping layer ECL may include at least one inorganic film (not illustrated) and at least one organic film (not illustrated). In one embodiment, for example, the capping layer ECL may include a first inorganic film on the second electrode CE, a first organic film on the first inorganic film, and a second organic film on the first organic film. In such an embodiment, the inorganic film may include at least one of a silicon oxide, a silicon nitride, a silicon oxynitride, an aluminum oxide, a titanium oxide, a zirconium oxide and a tin oxide. In such an embodiment, the organic film may include at least one of acryl, PI, PA and BCB.

In an embodiment, as described above, the capping layer ECL is provided to isolate the display element OLED from an external environment, but the disclosure is not limited thereto. In an alternative embodiment, an encapsulation substrate may be provided instead of the capping layer ECL to isolate the display element OLED from the external environment. In such an embodiment, the encapsulation substrate may adhere to the substrate SUB by a sealant. In an embodiment, where the display element OLED is isolated from the external environment using the encapsulation substrate, the capping layer ECL may be omitted.

The housing 200 may define a space in which the flexible display panel 100 is contained or disposed when the flexible display panel 100 in the unrolled state. The housing 200 may have a tubular shape in which one side is closed and the other side is opened. In an embodiment, a cross section of the housing 200 may have a circular ring shape to contain the flexible display panel 100 which is rolled.

In such an embodiment, a first opening 210 of a slot shape is defined in the housing 200. The first opening 210 may be a passage for rolling and unrolling the flexible display panel 100. In an embodiment, the flexible display panel 100 may be rolled into the housing 200 or may be unrolled outside the housing 200 through the first opening 210.

A shape of the first opening 210 may correspond to a cross-sectional shape of the flexible display panel 100. Here, a cross-sectional direction of the flexible display panel 100 may be a direction perpendicular to a rolling and unrolling direction of the flexible display panel 100.

The rolling driver 300 may include a rolling shaft 310 and a rotation motor 320 which rotates the rolling shaft 310. The rolling shaft 310 may be coupled to the rotation motor 320 and may be connected to one end of the flexible display panel 100. The rolling shaft 310 may be rotated by the rotation motor 320. When the rolling shaft 310 rotates, the flexible display panel 100 may be rolled into the housing 200 or may be unrolled outside the housing 200. The rotation motor 320 may rotate the rolling shaft 310, based on control of the rolling controller 600.

In an embodiment, the rolling stopper 400 is connected to another end of the flexible display panel 100, which is opposite to the one end, to prevent the entire flexible display panel 100 from being rolled into the housing 200. In an embodiment, a user may manually unroll the flexible display panel 100 using the rolling stopper 400.

The sensor unit 500 may be disposed on an external surface of the housing 200. The sensor unit 500 may sense completion of rolling of the flexible display panel 100. When the rolling of the flexible display panel 100 is completed, the sensor unit 500 may transmit a rolling completion signal to the rolling controller 600.

In an embodiment, the sensor unit 500 may include a contact sensor. The contact sensor may be a sensor that senses a contact of an object through a change in capacitance, resistance, or voltage. Accordingly, in such an embodiment, when the rolling stopper 400 comes into contact with the sensor unit 500, the sensor unit 500 may sense completion of rolling of the flexible display panel 100. In such an embodiment, when the sensor unit 500 senses completion of the rolling of the flexible display panel 100, the sensor unit 500 may transmit the rolling completion signal to the rolling controller 600.

In an embodiment according, as described above, the sensor unit 500 may be a contact sensor, but the disclosure is not limited thereto. In embodiments of the invention, the sensor unit 500 may be any type of sensor as long as the sensor unit 500 effectively senses the completion of rolling of the flexible display panel 100. In one alternative embodiment, for example, the sensor unit 500 may include a proximity sensor.

The rolling controller 600 may cover the other side of the housing 200. The rolling controller 600 may control an operation of the rolling driver 300, e.g., the rotation motor 320. In one embodiment, for example, the rolling controller 600 may operate the rotation motor 320 in response to an input signal to cause the flexible display panel 100 to be rolled or unrolled. In such an embodiment, the rolling controller 600 may maintain a rotation direction of the rotation motor 320 for unfolding and rolling the flexible display panel 100.

An embodiment of a method for driving the display device will hereinafter be described.

When a first signal that instructs unrolling of the flexible display panel 100 is input to the rolling controller 600, the rolling controller 600 may rotate the rotation motor 320 in a clockwise direction or a counterclockwise direction, for example, the clockwise direction, and thereby, the flexible display panel 100 may be unrolled.

When a second signal that instructs rolling of the flexible display panel 100 is input in a state where the flexible display panel 100 is unrolled, the rolling controller 600 may rotate the rotation motor 320 in the clockwise direction, and thereby, the flexible display panel 100 may be rolled. In such an embodiment, the rolling controller 600 may maintain the rotation direction of the rotation motor 320 for unrolling the flexible display panel 100, and thereby, the flexible display panel 100 may be rolled.

In such an embodiment, when the rolling stopper 400 comes into contact with the sensor unit 500 at the time of rolling the flexible display panel 100, the sensor unit 500 may transmit a rolling completion signal to the rolling controller 600. When the rolling controller 600 receives the rolling completion signal, the rolling controller 600 may stop the operation of the rotation motor 320. In such an embodiment, when the rolling controller 600 receives the rolling completion signal, the rolling controller 600 may generate and store first rotation change data for changing the rotation direction of the rotation motor 320 for unrolling and rolling of the flexible display panel 100. The rolling controller 600 may change the rotation direction of the rotation motor 320 in response to the first signal and the second signal, based on the first rotation change data. In such an embodiment, when the flexible display panel 100 is rolled, the rotation motor 320 may rotate in a direction opposite to the rotation direction of the rotation motor 320, that is, in a counterclockwise direction, thereby, unrolling and rolling the flexible display panel 100.

In an embodiment, when the first signal is input in a state where the rolling of the flexible display panel 100 is completed, the rolling controller 600 may rotate the rotation motor 320 in any one direction of a clockwise direction and a counterclockwise direction, for example, in a counterclockwise direction, based on the first rotation change data. The rotation motor 320 may rotate in a counterclockwise direction, thereby, unrolling the flexible display panel 100.

When the second signal is input in a state where the flexible display panel 100 is unrolled, the rolling controller 600 may rotate the rotation motor in the counterclockwise direction, based on the first rotation change data. As the rotation motor 320 rotates in the counterclockwise direction, the flexible display panel 100 may be rolled.

When the rolling stopper 400 comes into contact with the sensor unit 500 at the time of rolling the flexible display panel 100, the rolling controller 600 may stop the operation of the rotation motor 320. In addition, the rolling controller 600 may generate and store second rotation change data for changing the rotation direction of the rotation motor 320 for unrolling and rolling of the flexible display panel 100.

The flexible display panel 100 may be unrolled as the rotation motor 320 rotates in the clockwise direction, based on the second rotation change data. In such an embodiment, the flexible display panel 100 may be rolled as the rotation motor 320 rotates in the clockwise direction, based on the second rotation change data.

If a display device does not include the sensor unit 500, and is constantly performs the rolling and unrolling operations without changing the rolling direction and the unrolling direction of the flexible display panel 100.

If the flexible display panel 100 is rolled in a state where the display device does not include the sensor unit 500, compressive stress may be applied to one of the first surface FS and the second surface BS of the flexible display panel 100, and tensile stress may be applied to the other of the first surface FS and the second surface BS of the flexible display panel 100.

Accordingly, the compressive stress and the tensile stress may be continuously applied to the first surface FS and the second surface BS. If the compressive stress and the tensile stress are continuously applied to the first surface FS and the second surface BS, the flexible display panel 100 may be deformed by the compressive stress and the tensile stress. If the flexible display panel 100 is deformed, the flexible display panel 100 may not be flat and may have a predetermined curvature, even if the flexible display panel 100 is unrolled.

In an embodiment of the invention, the display device changes the rolling direction and the unrolling direction of the flexible display panel 100, a same stress may not be applied to a predetermined surface.

In such an embodiment, when the rotation motor 320 rotates in the clockwise direction to unroll the flexible display panel 100 and the rotation motor 320 rotates in the clockwise to roll the flexible display panel 100, the first surface FS of the rolled flexible display panel 100 may have a concave curve shape and the second surface BS may have a convex curve shape, as illustrated in FIG. 6. Accordingly, the compressive stress may be applied to the first surface FS, and the tensile stress may be applied to the second surface BS.

In such an embodiment, when the rotation motor 320 rotates in the counterclockwise direction to unroll the flexible display panel 100 and the rotation motor 320 rotates in the counterclockwise direction to roll the flexible display panel 100, the first surface FS of the rolled flexible display panel 100 may have a convex curve shape and the second surface BS of the flexible display panel 100 may have a concave curve shape, as illustrated in FIG. 7. Accordingly, the tensile stress may be applied to the first surface FS, and a compressive stress may be applied to the second surface BS.

In such an embodiment, when the flexible display panel 100 is unrolled and rolled while the rotation direction of the rotation motor 320 changes, the compressive stress and the tensile stress may be alternately applied to the first surface FS of the flexible display panel 100. In such an embodiment, the tensile stress and the compressive stress may be alternately applied to the second surface BS of the flexible display panel 100.

Accordingly, in such an embodiment, the opposing stresses are alternately applied to the first surface FS and the second surface BS, such that the flexible display panel 100 may be effectively prevented from being deformed.

Figure 8:
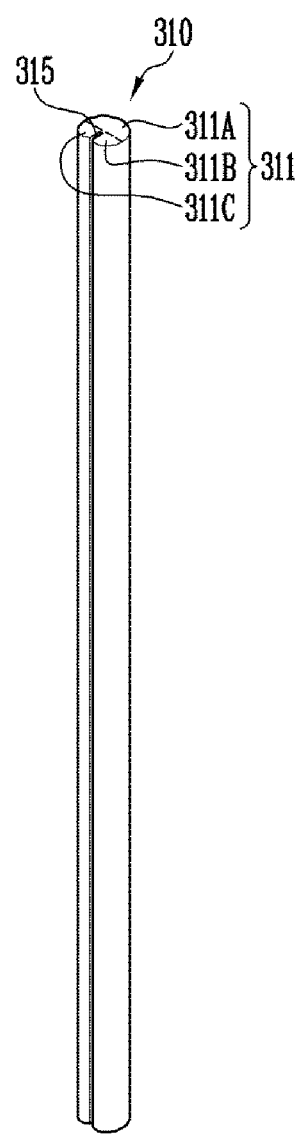
FIG. 8 is a perspective view illustrating a rolling shaft illustrated in FIGS. 1 to 5.

FIG. 8 is a perspective view illustrating the rolling shaft illustrated in FIGS. 1 to 5, and FIG. 9 is a sectional view of the rolling shaft taken in a direction perpendicular to a length direction of the rolling shaft illustrating in FIG. 8.

Figure 9:
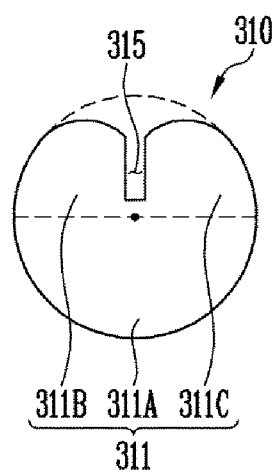
FIG. 9 is a cross-sectional view of the rolling shaft taken in a direction perpendicular to a length direction of the rolling shaft illustrating in FIG. 8.

Referring to FIGS. 8 and 9, in an embodiment, the rolling shaft 310 may have a rod shape. In such an embodiment, the cross section of the rolling shaft 310 in a direction perpendicular to a length direction of the rolling shaft 310 may not be a ring shape.

In such an embodiment, the rolling shaft 310 may include a body portion 311 having a rod shape, and a panel coupling portion 315 is defined in the rolling shaft 310 along a direction parallel to a length direction of the body portion 311 and is coupled to the flexible display panel (refer to "100" of FIGS. 1 to 5).

The body 311 may be connected to the rotation motor 320 and may rotate. The body portion 311 may include a plurality of curvature portions 311A, 311B and 311C with different curvatures.

In one embodiment, for example, the body portion 311 may include a first curvature portion 311A with a first curvature, a second curvature portion 311B with a second curvature different from the first curvature, and a third curvature portion 311C with a third curvature different from the first curvature.

The first curvature may be the same in the entire first curvature portion 311A. Accordingly, a radius of curvature of the first curvature portion 311A may be constant. In such an embodiment, the first curvature portion 311A may be a part of a circumference having a predetermined radius of curvature.

One end of the second curvature portion 311B may be connected to one end of the first curvature portion 311A, and the other end of the second curvature portion 311B may be connected to the portion of the rolling shaft 310 defining the panel coupling portion 315. The second curvature of the second curvature portion 311B may be greater than the first curvature. The second curvature may gradually increase from the one end of the first curvature portion 311A toward the panel coupling portion 315.

One end of the third curvature portion 311C may be connected to the other end of the first curvature portion 311A, and the other end of the third curvature portion 311C may be connected to the portion of the rolling shaft 310 defining the panel coupling portion 315. The third curvature of the third curvature portion 311C may be greater than the first curvature. The third curvature may gradually increase from the other end of the first curvature portion 311A toward the panel coupling portion 315. In an embodiment, the third curvature may be substantially the same as the second curvature.

The panel coupling portion 315 may have a trench shape in which a part of the body portion 311 is recessed toward the center of the first curvature portion 311A.

In such an embodiment, when the flexible display panel 100 is rolled with a shape in which the body portion 311 includes only the first curvature portion 311A, a bending angle of the flexible display panel 100 may be small in a region adjacent to the panel coupling portion 315. If the bending angle of the flexible display panel 100 is small, the flexible display panel 100 may be deformed or broken.

In an embodiment of the invention, as described above, the body portion 311 may have the first curvature portion 311A, the second curvature portion 311B and the third curvature portion 311C. Accordingly, in such an embodiment, when the flexible display panel 100 is rolled by using the rolling shaft 310, the bending angle of the flexible display panel 100 may increase in a region adjacent to the panel coupling portion 315. When the bending angle increases, the flexible display panel 100 may be effectively prevented from being deformed or broken.

Figure 10:
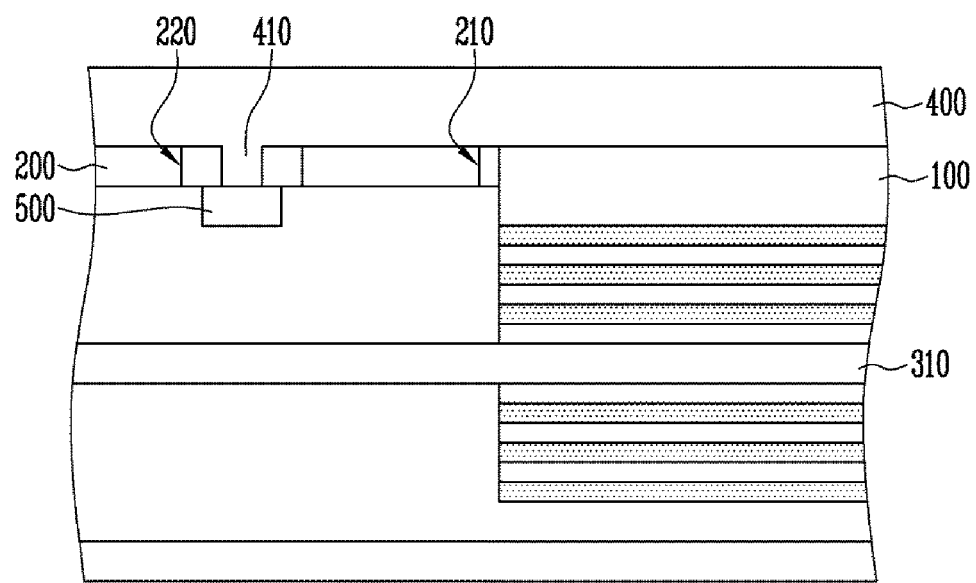
FIG. 10 is a partial cross-sectional view illustrating the display device according to an embodiment of the disclosure.

FIG. 10 is a partial cross-sectional view illustrating the display device according to an embodiment of the disclosure. More particularly, FIG. 10 is a cross-sectional view taken in a direction parallel to a length direction in a state where the flexible display panel is rolled.

Referring to FIG. 10, an embodiment of the display device may include the flexible display panel 100, the housing 200 which may contain the flexible display panel 100, the rolling driver (refer to "300" of FIGS. 1 to 5) which may roll or unroll the flexible display panel 100, the rolling stopper 400 which stops the rolling of the flexible display panel 100, the sensor unit 500 which senses whether or not the flexible display panel 100 is rolled, and the rolling controller (refer to "600" of FIGS. 1 to 5) which may control the operation of the rolling driver 300.

The housing 200 may define a space in which the flexible display panel 100 is contained. In such an embodiment, a first opening 210 is defined in a part of the housing 200 and a second opening 220 is defined in a part of the housing 200 to be spaced apart from the first opening 210.

The first opening 210 is a passage for rolling and unrolling the flexible display panel 100 and may have a slot shape. The shape of the first opening 210 may correspond to a cross-sectional shape of the flexible display panel 100. Here, a cross-sectional direction of the flexible display panel 100 may be a direction perpendicular to a rolling and unrolling direction of the flexible display panel 100.

The rolling drivee 300 may include the rolling shaft 310 and the rotation motor (refer to "320" of FIGS. 1 to 5) which rotates the rolling shaft 310.

The rolling shaft 310 may be connected to one end of the flexible display panel 100. The rolling shaft 310 may be rotated by the rotation motor 320.

The rolling stopper 400 may be connected to another end of the flexible display panel 100, which is opposite to the one end, to effectively prevent the entire flexible display panel 100 from being rolled into the housing 200.

The rolling stopper 400 may further include a protrusion portion 410 facing the second opening 220. When the flexible display panel 100 is rolled, the protrusion portion 410 may be inserted into the second opening 220 to come into contact with the sensor unit 500. In such an embodiment, a height at which the protrusion portion 410 protrudes may be greater than or equal to a thickness of the housing 200.

The sensor unit 500 may be disposed on an inner surface of the housing 200. In such an embodiment, at least a part of the sensor unit 500 may be exposed by the second opening 220.

The sensor unit 500 may sense completion of rolling of the flexible display panel 100. The sensor unit 500 may include a contact sensor. Accordingly, when the protrusion portion 410 of the rolling stopper 400 comes into contact with the sensor unit 500, the sensor unit 500 may transmit a rolling completion signal to the rolling controller 600.

The rolling controller 600 may control an operation of the rotation motor 320. In such an embodiment, the rolling controller 600 may store rotation change data for changing a rotation direction of the rotation motor 320 in response to the rolling completion signal. Accordingly, the rolling controller 600 may change the rotation direction of the rotation motor 320 when rolling and unrolling is subsequently performed.

Figure 11:
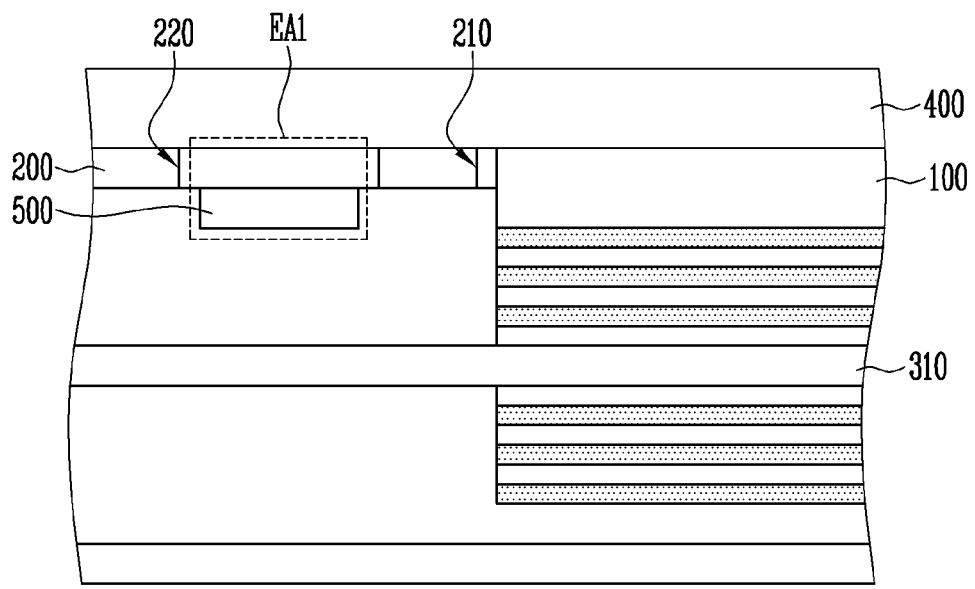
FIG. 11 is a partial sectional view illustrating the display device according to an alternative embodiment of the disclosure.
Figure 12:
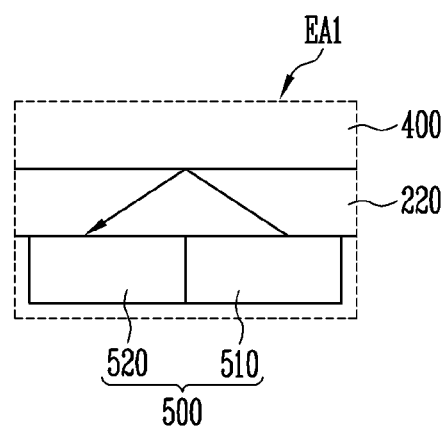
FIG. 12 is an enlarged view of the portion EA1 in FIG. 11.

FIG. 11 is a partial cross-sectional view illustrating the display device according to an alternative embodiment of the disclosure. More particularly, FIG. 11 is a cross-sectional view taken in a direction parallel to a length direction in a state where the flexible display panel is rolled. FIG. 12 is an enlarged view of the portion EA1 of FIG. 11.

Referring to FIGS. 11 and 12, an embodiment of the display device may include the flexible display panel 100, the housing 200 which may contain the flexible display panel 100, the rolling driver (refer to "300" of FIGS. 1 to 5) which may roll or unroll the flexible display panel 100, the rolling stopper 400 which stops rolling of the flexible display panel 100, the sensor unit 500 which senses whether or not the flexible display panel 100 is rolled, and the rolling controller (refer to "600" of FIGS. 1 to 5) which may control an operation of the rolling driver 300.

The housing 200 may define a space in which the flexible display panel 100 is contained. In such an embodiment, the first opening 210 is defined in a part of the housing 200 and the second opening 220 is defined in a part of the housing 200 to be spaced apart from the first opening 210.

The first opening 210 is a passage for rolling and unrolling the flexible display panel 100 and may have a slot shape. A shape of the first opening 210 may correspond to a cross-sectional shape of the flexible display panel 100. Here, a cross-sectional direction of the flexible display panel 100 may be a direction perpendicular to a rolling and unrolling direction of the flexible display panel 100.

The rolling driver 300 may include the rolling shaft 310 and the rotation motor (refer to "320" of FIGS. 1 to 5) which rotates the rolling shaft 310. The rolling shaft 310 may be connected to one end of the flexible display panel 100. The rolling shaft 310 may be rotated by the rotation motor 320.

The rolling stopper 400 may be connected to another end of the flexible display panel 100, which is opposite to the one end, to prevent the entire flexible display panel 100 from being rolled into the housing 200.

The sensor unit 500 may be disposed on an inner surface of the housing 200. At least a part of the sensor unit 500 may be exposed by the second opening 220.

The sensor unit 500 may include a proximity sensor. In one embodiment, for example, the sensor unit may include a light emitting portion 510 which emits light, and a light receiving portion 520 which absorbs light.

The light receiving portion absorbs the light, which is emitted from the light emitting portion 510 to the second opening 220 and is reflected by the rolling stopper 400, and thereby the sensor unit 500 may determine whether or not the rolling stopper 400 approaches. In such an embodiment, when the amount of the reflected light absorbed by the light receiving portion 520 exceeds a reference value, the sensor unit 500 may determine that the rolling stopper 400 is in contact with the housing 200. In such an embodiment, when the amount of the reflected light absorbed by the light receiving portion 520 exceeds the reference value, the sensor unit 500 may determine that rolling of the flexible display panel 100 is completed and may transmit a rolling completion signal to the rolling controller 600.

The rolling controller 600 may control the operation of the rotation motor 320. In such an embodiment, the rolling controller 600 may store rotation change data for changing a rotation direction of the rotation motor 320 in response to the rolling completion signal. Accordingly, the rolling controller 600 may change the rotation direction of the rotation motor 320 when rolling and unrolling is subsequently performed.

The aforementioned description is provided to exemplify and describe the disclosure. In addition, the aforementioned description simply exemplifies and describes the preferred embodiment of the disclosure, may be applied to various other combinations, modifications, and environments as set forth above, and may be changed or modified within the scope of concept of the disclosure disclosed in the specification, within the scope equivalent to the disclosure contents herein, and/or within the skill or knowledge of those skilled in the art. Accordingly, the above detailed description of the disclosure is not intended to limit the disclosure to the disclosed embodiments. In addition, the appended claims should be construed to include other embodiments.

What is claimed is:

1. A display device comprising:
   a flexible display panel;
   a rolling driver comprising:
      a rolling shaft connected to one end of the flexible display panel; and
      a rotation motor which rotates the rolling shaft;
   a housing which receives the flexible display panel in a rolled state, wherein a first opening is defined in the housing for unrolling and rolling the flexible display panel;
   a rolling stopper coupled to another end of the flexible display panel, which is opposite to the one end; and
   a rolling controller which controls the rolling driver such that the rotation motor rotates in a clockwise direction or a counterclockwise direction,
   wherein the rolling controller rotates the rotating motor in a direction opposite to a rotating direction of the rotation motor for a previous rolling operation to unroll the flexible display panel, and
   wherein the rolling controller rotates the rotating motor in a same direction as a rotating direction of the rotation motor for a previous unrolling operation to roll the flexible display panel.

2. The display device according to claim 1, further comprising;
   a sensor unit which senses a completion of rolling of the flexible display panel.

3. The display device according to claim 2, wherein the sensor unit is disposed on an external surface of the housing.

4. The display device according to claim 3, wherein
   the sensor unit includes a contact sensor, and
   the sensor unit senses the completion of rolling of the flexible display panel based on a contact thereof with the rolling stopper.

5. The display device according to claim 2, wherein
   the sensor unit is disposed on an inner surface of the housing, and
   a second opening is defined in the housing to expose a part of the sensor unit.

6. The display device according to claim 5, wherein
   the rolling stopper further includes a protrusion portion corresponding to the second opening, and
   the sensor unit senses the completion of rolling of the flexible display panel based on a contact thereof with the protrusion portion.

7. The display device according to claim 5, wherein the sensor unit includes:
- a light emitting portion which emits light to the second opening; and
- a light receiving portion which absorbs light reflected by the rolling stopper.

8. The display device according to claim 1, wherein the rolling shaft includes:
- a body portion having a rod shape; and
- a panel coupling portion having a trench shape which is recessed in a part of the body portion.

9. The display device according to claim 8, wherein the body portion includes a first curvature portion with a first curvature, a second curvature portion with a second curvature different from the first curvature, and a third curvature portion with a third curvature different from the first curvature, when viewed in a cross section perpendicular to a length direction.

10. The display device according to claim 9, wherein
- one end of the second curvature portion is connected to one end of the first curvature portion,
- the other end of the second curvature portion is connected to the panel coupling portion, and
- one end of the third curvature portion is connected to the other end of the first curvature portion, and
- the other end of the third curvature portion is connected to the panel coupling portion.

11. The display device according to claim 9, wherein the second curvature and the third curvature are greater than the first curvature.

12. The display device according to claim 11, wherein the second curvature is substantially the same as the third curvature.

13. A method for driving a display device, the method comprising:
- first unrolling a flexible display panel of the display device by rotating a rotation motor of the display device in any one direction of a clockwise direction and a counterclockwise direction;
- first rolling the flexible display panel by rotating the rotation motor in a same direction as a rotation direction of the rotation motor for the first unrolling the flexible display panel; and
- second unrolling the flexible display panel by rotating the rotation motor in an opposite direction, which is opposite to a rotation direction of the rotation motor for the first rolling the flexible display panel.

14. The method for driving the display device according to claim 13, further comprising:
- transmitting a rolling completion signal to a rolling controller of the display device by sensing a completion of rolling of the flexible display panel through a sensor unit of the display device.

15. The method for driving the display device according to claim 14, further comprising:
- generating rotation change data, by the rolling controller, for the rotating the rotation motor in the opposite direction in the second unrolling the flexible display panel, when the rolling controller receives the rolling completion signal.

16. The method for driving the display device according to claim 15, further comprising:
- second rolling the flexible display panel by rotating the rotation motor in the opposite direction, after the second unrolling the flexible display panel.

17. The method for driving the display device according to claim 14, wherein
- one end of the flexible display panel is connected to a rolling shaft of the display device, wherein the rolling shaft is coupled to the rotation motor, and
- another end of the flexible display panel, which is opposite to the one end, is connected to a rolling stopper of the display device.

18. The method for driving the display device according to claim 17, wherein the sensor unit senses the completion of rolling of the flexible display panel based on a contact thereof with the rolling stopper.

19. The method for driving the display device according to claim 17, wherein
the sensor unit includes:
- a light emitting portion which emits light; and
- a light receiving portion which absorbs light reflected by the rolling stopper, and
- the sensor unit senses the completion of rolling of the flexible display panel by sensing the light reflected by the rolling stopper in the light receiving portion.

* * * * *